(12) United States Patent
 Uckert

(10) Patent No.: US 6,864,339 B2
(45) Date of Patent: Mar. 8, 2005

(54) PROCESS FOR PREPARING AROMATIC POLYMERS

(75) Inventor: Frank P. Uckert, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 39 days.

(21) Appl. No.: 10/289,946

(22) Filed: Nov. 7, 2002

(65) Prior Publication Data

US 2003/0092857 A1 May 15, 2003

Related U.S. Application Data

(60) Provisional application No. 60/365,389, filed on Mar. 18, 2002, and provisional application No. 60/348,830, filed on Nov. 13, 2001.

(51) Int. Cl.[7] .......................... C08G 61/00; C08G 79/08
(52) U.S. Cl. .......................... 528/4; 528/373; 528/391; 528/397; 528/487; 528/491
(58) Field of Search .......................... 528/4, 373, 391, 528/397, 487, 491; 428/411.1

(56) References Cited

U.S. PATENT DOCUMENTS

| 5,621,128 A | 4/1997 | Jendralla |
| 5,777,070 A | 7/1998 | Inbasekaran et al. |
| 6,124,462 A | 9/2000 | Li |
| 6,124,476 A | 9/2000 | Guram et al. |

FOREIGN PATENT DOCUMENTS

WO    WO 00/53656 A1    9/2000

OTHER PUBLICATIONS

Li, George Y., Highly active, air–stable palladium catalysts for Kumada–Tamao–Corriu cross–coupling reaction of inactivated aryl chlorides with aryl Grignard reagents, Journal of Organometallic Chemistry, 2002, 63–68, 653, Elsevier Science B.V.

*Primary Examiner*—Ramsey Zacharia

(57) ABSTRACT

The present invention is generally directed to a process for preparing aromatic polymers. It further relates to devices that are made with the polymers.

5 Claims, 12 Drawing Sheets

(i)

(ii)

(III)

III(a)

(IV)

IV(a)
 IV(b)
 IV(c)
 IV(d)
 IV(e)
 IV(f)
 IV(g)
 IV(h)
 IV(i)
 IV(j)

IV(k)
 IV(l)

IV(m)
 IV(n)
 IV(o)

IV(p)
 IV(q)

IV(r)
 IV(s)

IV(t)   IV(u)

IV(v)   IV(w)

IV(x)     IV(y)

IV(z)

(V)

V(c)
 V(d)

V(e)
 V(f)

V(g)

VI

VI(a)
 VI(b)

VI(c)
 VI(d)

VI(e)
 VI(f)

VI(g)
 VI(h)

(VII)

VII(a)

VII(b)

VII(c)                    VII(d)

VII(e)

(VIII)

VIII(a)

VIII(b)

VIII(c)

VIII(d)

(IX)

IX(a)

(X)

(XI)

(XII)

(XIII)

(XIV)

(XV)

(XVI)

PROCESS FOR PREPARING AROMATIC POLYMERS

BACKGROUND OF THE INVENTION

1. Field of the Invention

This invention relates to a process for preparing aromatic polymers. More particularly it relates to a process for preparing conjugated aromatic polymers and electronic devices made with such polymers.

2. Description of the Related Art

Organic electronic devices are present in many different kinds of electronic equipment. In all such devices, an organic active layer is sandwiched between two electrical contact layers. Examples of organic electronic devices include devices that emit light, such as light-emitting diodes (LEDs) that make up displays. In LEDs, at least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Several classes of conjugated aromatic luminescent polymers have also been disclosed. These include, for example, arylene vinylene polymers, such as poly(1,4-phenylene vinylene) and derivatives; polythiophenes, especially, poly(3-alkylthiophenes); poly(p-phenylenes); 2,7-poly(9,9-dialkylfluorenes); and copolymers thereof.

One method of preparing these polymers, particularly the arylene vinylene polymers, is to form soluble precursor polymers with thermally labile leaving groups. Heat treatment results in elimination of the leaving groups to form the conjugated polymer. Another route to these polymers is based on the Pd-catalyzed cross-coupling reacting between an aromatic boronic acid derivative and an aromatic halide, in the presence of an aqueous carbonate or bicarbonate base and an organic solvent. This route was first reported by Suzuki in *Synthetic Communications,* Vol. 11, No. 7, p. 513 (1981), and is commonly referred to as the "Suzuki method". However, this procedure requires long reaction times in an oxygen-free atmosphere. Also, control of the molecular weight is difficult and thus reproducibility is poor. A modified Suzuki method was reported by Inbasekaran et al. in U.S. Pat. No. 5,777,070, in which a phase transfer catalyst was added to facilitate the reaction of the boronate anion with the Pd-aromatic halide complex. However, reaction times were still long. A second modified method was reported by Towns et al., in published PCT application WO 00/53656, in which an aromatic halide was reacted with an aromatic with a boron functional group in the presence of a Pd catalyst and an organic base in an amount sufficient to convert the boron functional group into —B(X)$_3$— anionic groups. This reaction, although reportedly faster, still requires an oxygen-free atmosphere.

There is a continuing need for improved processes for preparing aromatic polymers.

SUMMARY OF THE INVENTION

The present invention is directed to a process for preparing aromatic polymers which includes the step of providing a reaction mixture comprising:

(a) a monomer mixture selected from:
  (i) a first monomer mixture comprising a plurality of at least one first aromatic monomer and a plurality of at least one second aromatic monomer, wherein the first aromatic monomer has at least two first reactive groups and has a Formula (I) below:

  $$X—Ar^1—X \quad (I)$$

wherein:
  X is the first reactive group selected from bromo, iodo, chloro, p-toluenesulfonate, methylsulfonate, and trifluoromethylsulfonate, and
  $Ar^1$ is an aromatic moiety;
  and wherein the second aromatic monomer has at least two second reactive groups and has a Formula (II) below:

  $$Y—Ar^2—Y \quad (II)$$

wherein:
  Y is the second reactive group selected from a boronic acid, a boronic ester and a borane, and
  $Ar^2$ is an aromatic moiety that is same or different from $Ar^1$ in Formula (I); and
  (ii) a second monomer mixture comprising a plurality of at least one third aromatic monomer and at least one fourth aromatic monomer, wherein the at least one third aromatic monomer has at least one first reactive group and at least one second reactive group and having Formula (III) below:

  $$X—Ar^3—Y \quad (III)$$

wherein:
  X and Y are as defined in Formula (I) and (II) respectively, and
  $Ar^3$ is an aromatic moiety that is the same or different from $Ar^1$ in Formula (I) and $Ar^2$ in Formula (II);
  and wherein the at least one fourth aromatic monomer has at least one first reactive group and at least one second reactive group and having Formula (IV) below:

  $$X—Ar^4—Y \quad (IV)$$

wherein:
  X and Y are as defined in Formula (I) and (II) respectively, and
  $Ar^4$ is an aromatic moiety that is the same or different from $Ar^1$ in Formula (I), $Ar^2$ in Formula (II) and $Ar^3$ in Formula (III);

(b) a catalytic amount of a catalyst comprising a phosphine oxide transition metal complex dimer comprising two transition metal atoms bonded to at least one phosphine oxide ligand each, wherein each transition metal is bonded to said ligands via metal-phosphorus bonds, and wherein the two transition metal atoms are bridged via two halogen atoms, (c) a base, and (d) an organic solvent.

The invention is also directed to an organic electronic device having at least one active layer comprising the aromatic polymer made by the above process.

As used herein, the term "polymer" refers to both homopolymers and copolymers. The term "copolymer" is intended to mean a polymer of two or more different monomeric units. The term "hydrocarbyl" is intended to mean a straight chain, branched or cyclic arrangement of carbon atoms connected by single, double, or triple carbon to carbon bonds and/or by ether linkages, and substituted accordingly with hydrogen atoms. Such hydrocarbyl groups may be aliphatic and/or aromatic. The term "heterocyclic" is intended to mean a carbocyclic group having a single ring, multiple rings, or multiple condensed rings in which at least one ring contains a heteroatom selected from the group consisting of nitrogen, oxygen and sulfur. Such heterocyclic groups may be aliphatic and/or aromatic. The the term "alkyl" is intended to mean a group derived from an aliphatic hydrocarbon, and includes, linear, branched and cyclic groups, which may be unsubstituted or substituted. The term "heteroalkyl" is intended to mean a group derived from an aliphatic hydrocarbon having at least one heteroatom in the main chain, which group may be unsubstituted or substituted. The term "aryl" is intended to mean a group derived from an aromatic hydrocarbon, which may be unsubstituted or substituted. The term "heteroaryl" is intended to mean a group derived from an aromatic group containing at least one heteroatom, which group may be unsubstituted or substituted. The term "arylene" is intended to mean an aryl group having two points of attachment in the polymer chain. The term "heteroarylene" is intended to mean a heteroaryl group having two points of attachment in the polymer chain. The phrase "adjacent to," when used to refer to layers in a device, does not necessarily mean that one layer is immediately next to another layer. On the other hand, the phrase "adjacent R groups", is used to refer to R groups that are next to each other in a chemical Formula (i.e., R groups that are on atoms joined by a bond). The term "photoactive" refers to any material that exhibits electroluminescence and/or photosensitivity. The term "monomeric unit" refers to a repeating unit in a polymer. In addition, the IUPAC numbering system is used throughout, where the groups from the Periodic Table are numbered from left to right as 1–18 (CRC Handbook of Chemistry and Physics, 81$^{st}$ Edition, 2000).

DETAILED DESCRIPTION OF THE PREFERRED EMBODIMENTS

Figure 1:
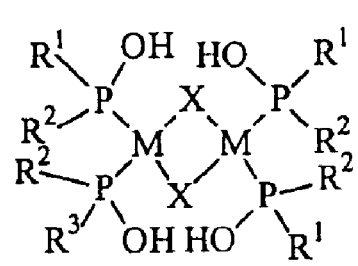
FIG. 1 shows Formula i and Formula ii for a catalyst useful in the process of the invention.
Figure 1:
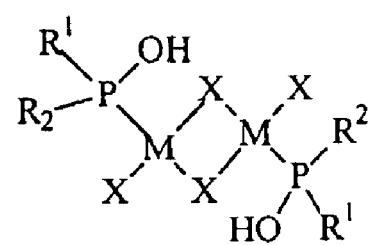

The process of the invention may be used to form polymers comprising aromatic monomeric units.

Components

A. Monomer Mixtures

The polymers are formed from a reaction of a mixture of aromatic monomers. Collectively, the aromatic monomers useful in the reaction mixture of the invention have two types of reactive groups: first reactive groups ("X") selected from bromo, iodo, chloro, p-toluenesulfonate, methylsulfonate, and trifluoromethylsulfonate; and second reactive groups ("Y") selected from a boronic acid, a boronic ester and a borane. Depending upon the composition of the reaction mixture, the resulting polymer can be a homopolymer, an alternating copolymer, or a statistical copolymer.

In the first monomer mixture ((i) above), a first monomer comprising an aromatic moiety having Formula (I) above is reacted with a second monomer comprising an aromatic moiety having Formula (II) above. Where the aromatic moieties of the first monomer and the second monomer are the same ($Ar^1=Ar^2$), the resulting polymer will be a homopolymer. Where the aromatic moieties of the first monomer and the second monomer are different, the resulting polymer will be an alternating copolymer having alternating $Ar^1$ and $Ar^2$ monomeric units.

Alternatively, the first monomer mixture may comprise more than one first monomer having aromatic moieties that are different from each other (for example, $Ar^{1A}$ and $Ar^{1B}$), and/or more than one second monomer having aromatic moieties that are different from each other (for example, $Ar^{2A}$ and $Ar^{2B}$). The resulting copolymer will have alternating Ar1 and Ar2 monomeric units, with a statistical distribution of $Ar^{1A}$ and $Ar^{1B}$ and/or $Ar^{2A}$ and $Ar^{2B}$ monomeric units.

In the second monomer mixture ((ii) above), polymerization is carried out with a third monomer comprising an aromatic moiety having Formula (III) above and a fourth monomer comprising an aromatic moiety having Formula (IV) above. Where the aromatic moieties of the third monomer and the fourth monomer are the same ($Ar^3=Ar^4$); the resulting polymer will be a homopolymer. Where the aromatic moieties of the third monomer and the fourth monomer are different, the resulting polymer will be a statistical copolymer having $Ar^3$ and $Ar^4$ monomeric units. It is also possible to react three or more monomers of this type, X—$Ar^{4A}$—Y, X—$Ar^{4B}$—Y, X—$Ar^{4C}$—Y and the like, to form other statistical copolymers.

In all of the embodiments, the stoichiometry of the reaction should be taken into consideration. In order to form polymers, the number of moles of first reactive groups should be essentially equal to the number of moles of second reactive groups, in order to get high molecular weight polymers. When stoichiometric amounts of reactants are not used, low molecular weight oligomers are generally formed.

Examples of suitable aromatic moieties include $C_{6-20}$ mononuclear/polynuclear aromatic hydrocarbons, $C_{2-10}$ mononuclear/polynuclear heterocycles, and tertiary arylamines. Examples of mononuclear/polynuclear aromatic hydrocarbon groups include phenylene, naphthylene, fluorene, acenaphthene, phenanthrene, anthracene, fluoranthene, pyrene, perylene, rubrene, and chrysene. Examples of mononuclear/polynuclear heterocyclic groups include 5-member heterocycles with O, S, or N, such as furan, thiophene, pyrrole, oxazole, isooxazole, thiazole, isothiazole, imidazole, oxadiazoles, thiadiazole, and pyrazoles; 6-member heterocycles with O, S, or N, such as pyridine, pyridazine, pyrimidine, pyrazine, triazines, and tetrazenes; benzo-fused ring systems such as benzoxazole, benzothiazole, benzimidazole, quinoline, isoquinoline, cinnoline, quinazoline, quinoxaline, phthalazine, benzothiadiazole, and benzotriazines; and polynuclear condensed ring systems such as phenazine, phenanthridine, acridine, carbazole, and diphenylene oxide. Examples of tertiary arylamine groups include triphenylamine, N,N'-diphenylbenzidine, N,N'-diphenyl-1,4-phenylenediamine, and diphenylnaphthylamine.

The aromatic groups may be substituted optionally with one or more substituents. Examples of substituents include $C_{1-20}$ hydrocarbyl radicals, $C_{1-20}$ (thio)alkoxy radicals, $C_{1-20}$ (thio)aryloxy radicals, cyano, fluoro, chloro, $C_{1-20}$ alkoxycarbonyl, $C_{1-20}$ aryoxylcarbonyl, poly(alkyleneoxy) and alkyl(aryl)sulfonyl radicals.

The first reactive group is preferably bromo and iodo. The second reactive group is preferably a $C_{1-6}$ boronic acid or boronic ester, more preferably a $C_{1-6}$ boronic ester. Preferably, an aromatic group having a single first reactive group and an aromatic group having a single second reactive group may be used as end-capping groups in such reactions, which will result in the formation of a terminal aryl group. It is particularly preferred to use end-capping compounds for both reactive groups, in which case the polymer is treated sequentially with the two end-capping compounds.

The substituents on the aromatic groups of the monomers and the end-capping group can be selected to modify the physical and/or electronic properties of the resulting polymer. Properties which may be affected include solubility, processability properties, film-forming properties, interchain interaction, compatibility in blends with host polymers, dielectric constant, electron mobility, ionic mobility, color and the like.

Examples of suitable aromatic monomers having two first reactive groups include 9,9-disubstituted-di-2,7-bromofluorenes and 4,7-dibromo-2,1,3-benzothiadiazole. Examples of suitable aromatic monomers having two second reactive groups include 9,9-dialkyl-2,7-fluorenediboronates and 9,9-diaryl-2,7-fluorenediboronates. Examples of suitable aromatic monomers having one first reactive group and one second reactive group include 4-bromobenzeneboronate and 9,9-disubstituted-2-bromo-7-fluoreneboronates.

Figure 2:
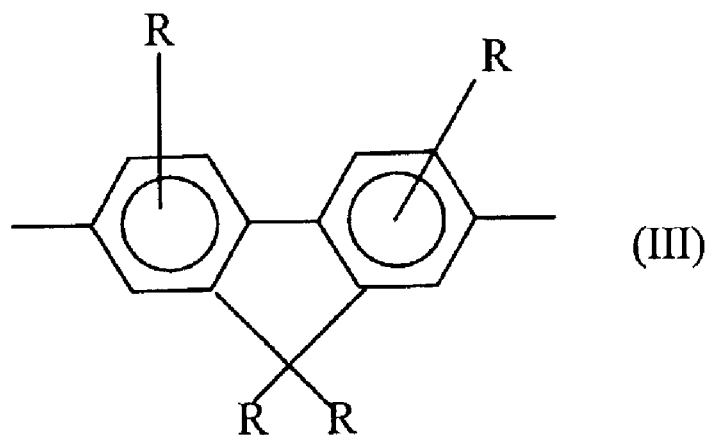
FIG. 2 shows Formula III and Formula III(a) for an aromatic moiety useful in the process of the invention.
Figure 2:
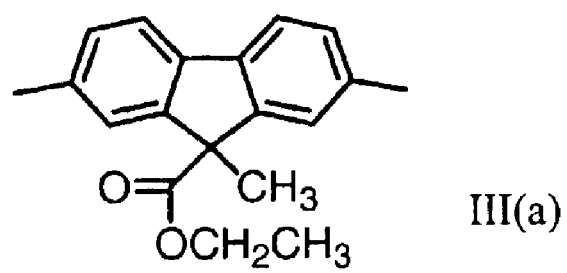
Figure 3:
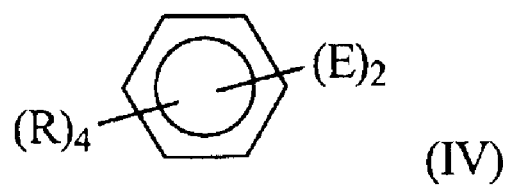
FIG. 3 shows Formula IV for an aromatic moiety useful in the process of the invention.
Figure 7:
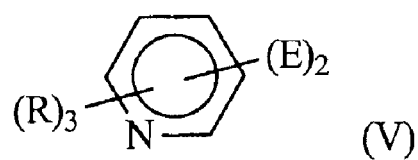
FIG. 7 shows Formula V and Formulae V(a) through V(g) for an aromatic moiety useful in the process of the invention.
Figure 7:
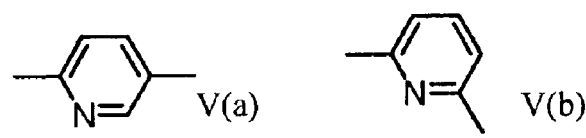
Figure 7:
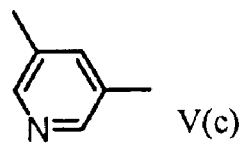
Figure 7:
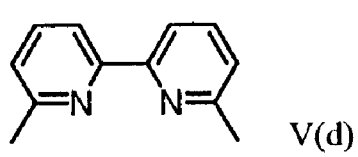
Figure 7:
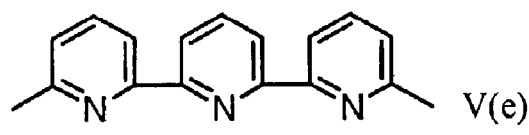
Figure 7:
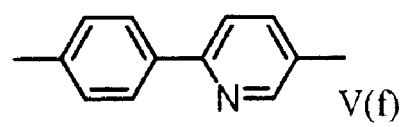
Figure 7:
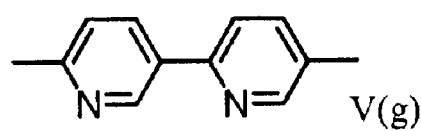

Preferably, the process of the invention is carried out with monomers comprising aromatic moieties selected from (i) fluorene groups having Formula III shown in FIG. 2, (ii) aromatic groups having Formula IV shown in FIG. 3, (iii) 6-membered heteroaromatic groups having Formula V, shown in FIG. 7; (iv) 5-membered heteroaromatic groups having Formula VI, shown in FIG. 8; (v) aromatic groups having Formula VII, shown in FIG. 9, (vi) fused ring aromatic groups having Formula VII, shown in FIG. 10, Formula IX, shown in FIG. 11, and Formula X through Formula XIII, shown in FIG. 12, and (vii) combinations thereof, where:
in each of Formulae III, IV, V, VI, VII, VIII, IX, and X through XIII:

R is a substituent on a carbon atom which can be the same or different at each occurrence and is selected from hydrogen, alkyl, aryl, heteroalkyl, heteroaryl, F, —CN, —OR⁹, —CO₂R⁹, $C_\psi H_\theta F_\lambda$, —OC$_\psi$H$_\theta$F$_\lambda$, —SR⁹, —N(R⁹)₂, —P(R⁹)₂, —SOR⁹, —SO₂R⁹, —NO₂, and beta-dicarbonyls having Formula XIV shown in FIG. 13 and as further described below under "Formula XIV"; or adjacent R groups together can form a 5- or 6-membered cycloalkyl, aryl, or heteroaryl ring, such that:
  R⁹ is a substituent on a heteroatom which can be the same or different at each occurrence and is selected from alkyl, aryl, heteroalkyl and heteroaryl; and
  ψ is an integer between 1 and 20, and θ and λ are integers satisfying Equation A1 below:

$$\theta + \lambda = 2\psi + 1; \quad \text{(Equation A1)};$$

in each of Formulae IV, V, VI, VII, VIII, IX, X, and XI:
E can be the same or different at each occurrence and is a single bond or a linking group selected from arylene and heteroarylene;
in Formula VI:
A is independently at each occurrence C or N and γ is 0 or an integer selected from 1 or 2, such that when both A are N, then γ is 0; or when one of A is N and one of A is C, then γ is 1; or when both A are C, then γ is 2;
Q is O, S, SO₂, or NR⁹ where:
  R⁹ is a substituent on a heteroatom which can be the same or different at each occurrence and is selected from alkyl, aryl, heteroalkyl and heteroaryl;
in Formula VII:
Q¹ is a carbonyl group, O, S, SO₂, or NR⁹ where:
  R⁹ is a substituent on a heteroatom which can be the same or different at each occurrence and is selected from alkyl, aryl, heteroalkyl and heteroaryl;
  W is H, alkyl or heteroalkyl; or both of W together can represent one single bond;
in Formula VIII:
the two E's are in the 1,2-, 1,3-, 1,4-, 1,5-, 1,6-, 1,8-, 1,7-, 1,3-, 2,3-, 2,4-, 2,5-, 2,6-, or 2,7-positions;
in Formula IX:
the two E's are in the 1,2-, 1,4-, 1,10-, 1,5-, 1,6-, 1,6-, 1,8-, 2,3-, 2,10-, 2,5-, 2,6-, 2,7-, or 9,10-positions;
in Formula X:
a first E is in the 1, 2, or 3 position, a second E is in the 6, 7, or 8 position;
in Formula XI:
a first E is in the 2, 3, or 4 position; a second E is in the 7, 8, or 9 position; and
in Formula XIV:
R¹⁰ is selected from alkyl, aryl, heteroalkyl and heteroaryl;
δ is 0 or an integer from 1 to 12.

Fluorene-based Aromatic Moieties

One preferred aromatic moiety is a fluorene-based unit having a Formula III shown in FIG. 2. The preferred R groups are alkyl groups having 1 to 30 carbon atoms, heteroalkyl groups having 1–30 carbon atoms and one or more heteroatoms of S, N, or O, aryl groups having from 6 to 18 carbon atoms, and heteroaryl groups having from 2 to 18 carbon atoms and one or more heteroatoms of S, N, or O. Examples of suitable R groups include n- and iso-butyl, pentyls, both linear and branched, hexyls, octyls, including 2-ethylhexyl, up through hexadecyls and above, with and without olefinic unsaturation; phenyl, thiophene, carbazole, alkoxy, phenoxy and cyano groups. More preferred R groups on the carbon atom in the 9-position of the fluorene aromatic moiety are linear and branched $C_6$ through $C_{10}$ alkyls. More preferred R groups on the phenyl rings of the fluorene aromatic moiety are H, $C_1$–$C_4$ alkoxy, phenoxy, $C_1$–$C_4$ alkyl, phenyl or cyano.

An example of a suitable first aromatic moiety is shown in FIG. 2 as Formula III(a).

Additional Aromatic Moieties

Figure 13:
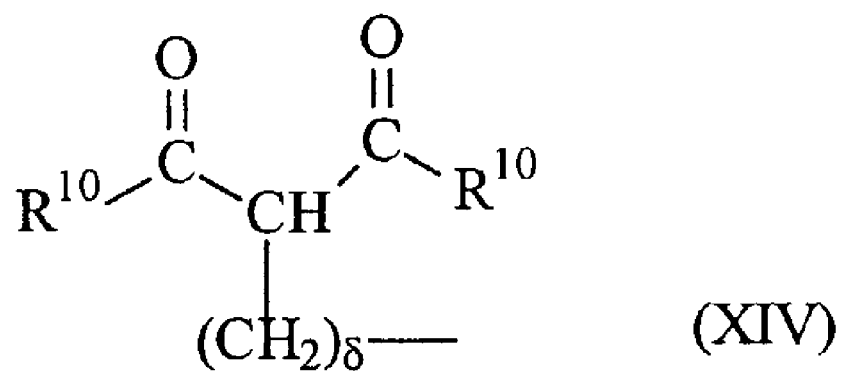
FIG. 13 shows Formulae XIV through XVI for substitutents for an aromatic moiety useful in the process of the invention.
Figure 13:
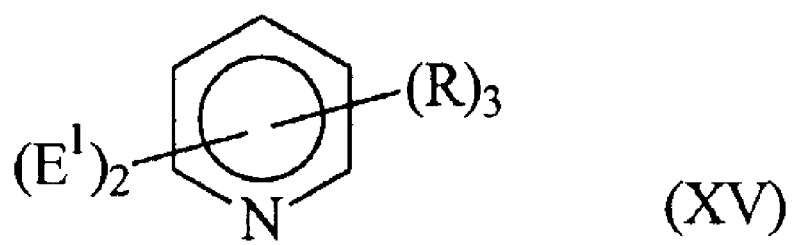
Figure 13:
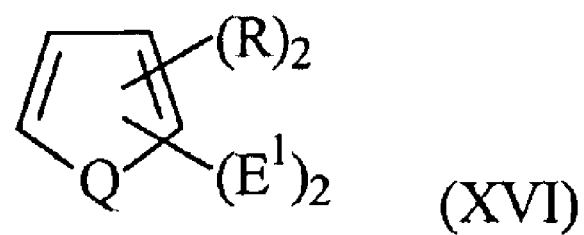

In each of Formulae IV, V, VI, VII, VIII, IX, X and XI, where any one or more of E linking groups are selected from heteroarylenes, then the hetereoarylenes can be selected from groups having Formulae XV and XVI shown in FIG. 13, where:
in Formula XV:
R is as described above for each of III, IV, V, VI, VII, VIII, IX, X through XIII;
$E^1$ is a single bond;
in Formula XVI:
R and Q are as described above for each of III, IV, V, VI, VII, VIII, IX, X through XIII; and
$E^1$ is a single bond.

Formula IV:

Alternatively, the aromatic moiety can be an aromatic having the structure shown in FIG. 3, Formula IV. The R groups are preferably selected from partially or fully fluorinated alkyl groups having from 1 to 12 carbon atoms, especially $CF_3$, alkoxy groups having from 1 to 12 carbon atoms, esters having from 3 to 15 carbon atoms, —$NO_2$, —$SR^9$, —$N(R^9)_2$, —$P(R^9)_2$, —$SOR^9$, —$SO_2R^9$, where $R^9$ is preferably an alkyl group having from 1 to 12 carbon atoms, and beta-dicarbonyls having Formula XIV shown in FIG. 13, where $R^{10}$ is preferably an alkyl group having from 1 to 12 carbon atoms and δ is preferably 0, 1, or 2.

Figure 4:
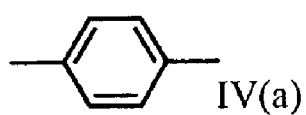
FIG. 4 shows Formulae IV(a) through IV(j) for an aromatic moiety useful in the process of the invention.
Figure 4:
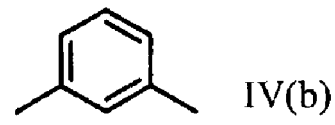
Figure 4:
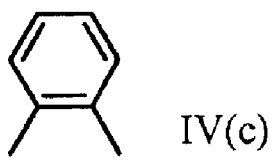
Figure 4:
Figure 4:
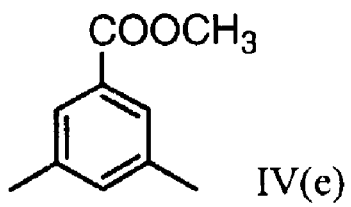
Figure 4:
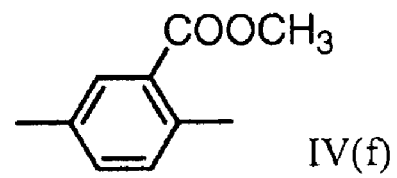
Figure 4:
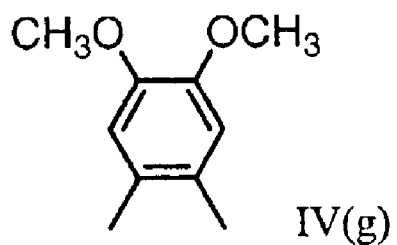
Figure 4:
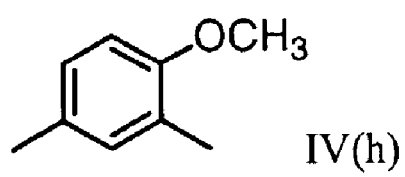
Figure 4:
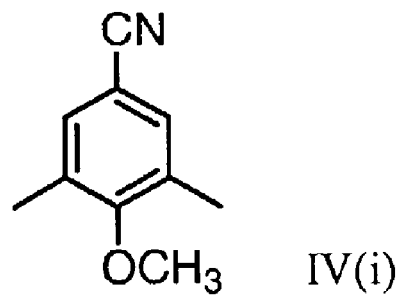
Figure 4:
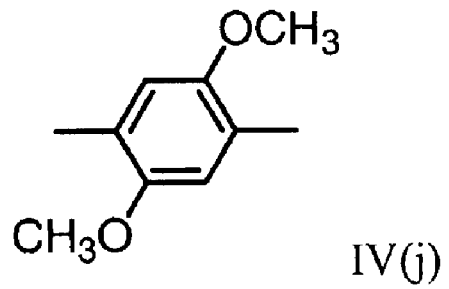
Figure 5:
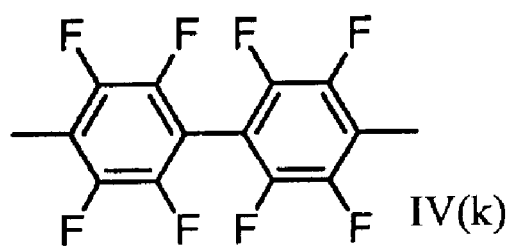
FIG. 5 shows Formulae IV(k) through IV(s) for an aromatic moiety useful in the process of the invention.
Figure 5:
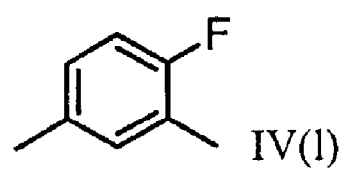
Figure 5:
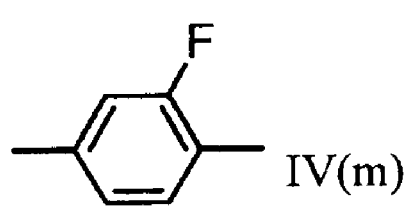
Figure 5:
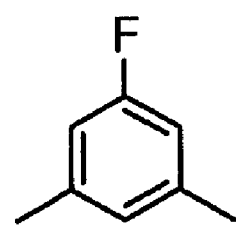
Figure 5:
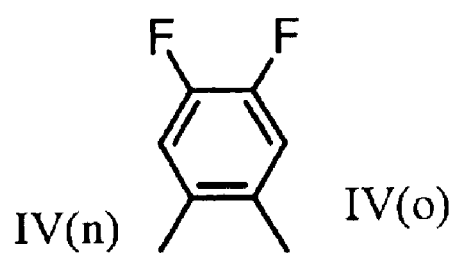
Figure 5:
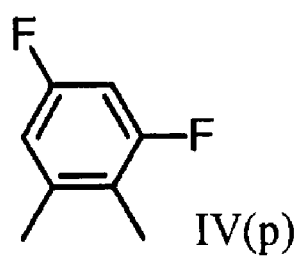
Figure 5:
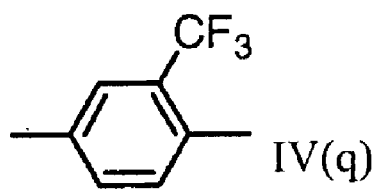
Figure 5:
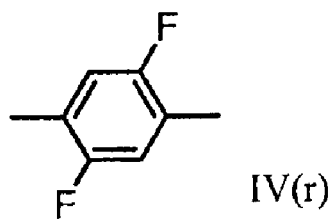
Figure 5:
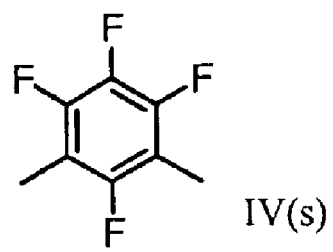
Figure 6:
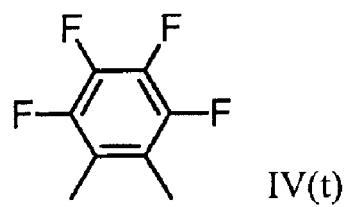
FIG. 6 shows Formulae IV(t) through IV(z) for an aromatic moiety useful in the process of the invention.
Figure 6:
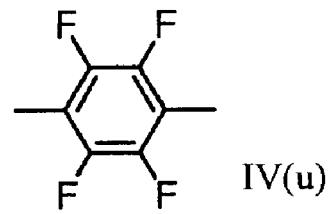
Figure 6:
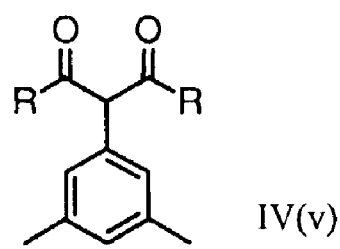
Figure 6:
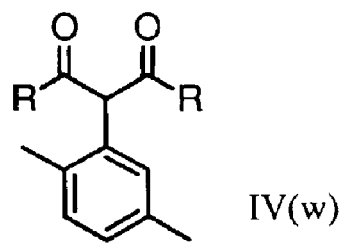
Figure 6:
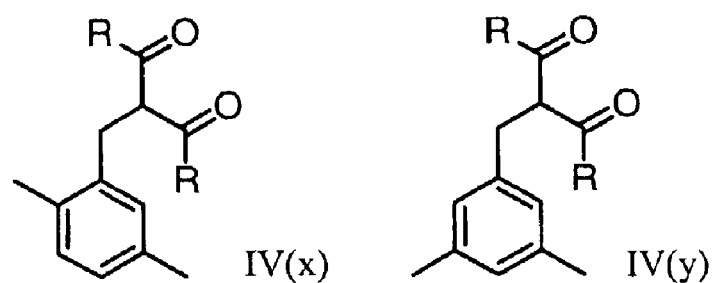
Figure 6:
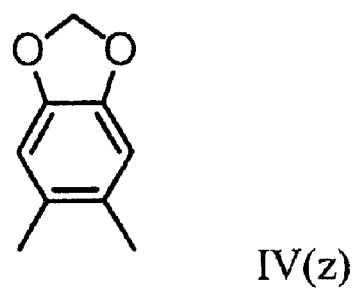

Examples of suitable second aromatic moieties with Formula IV are shown in FIGS. 4 through 6 as Formulae IV(a) through IV(z) where:
in Formulae IV(v) through IV(y):
R is as described above for each of Formulae III, IV, V, VI, VII, VIII, IX, X through XIII;

Formula V:

Alternatively, the aromatic moiety can be a divalent 6-membered-ring heteroaromatic group having the structure shown in FIG. 7, Formula V. Preferred R groups are hydrogen, $C_1$–$C_5$ alkyl groups, $C_6$–$C_{20}$ aryl groups, and $C_4$–$C_{20}$ heteroaryl groups. Examples of suitable E linking groups include pyridinediyl(—$C_5H_4N$—) and bipyridinediyl(—$C_5H_4N$—$C_5H_4N$—).

Examples of suitable aromatic moieties having Formula V are shown in FIG. 7 as Formulae V(a) through V(g).

Figure 8:
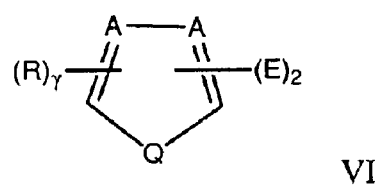
FIG. 8 shows Formula VI and Formulae VI(a) through VI(h) for an aromatic moiety useful in the process of the invention.
Figure 8:
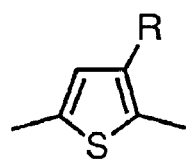
Figure 8:
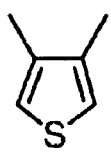
Figure 8:
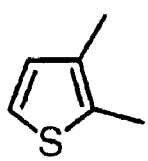
Figure 8:
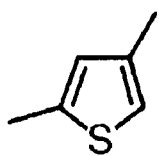
Figure 8:
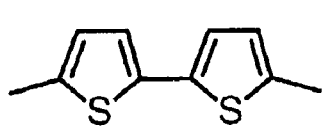
Figure 8:
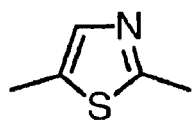
Figure 8:
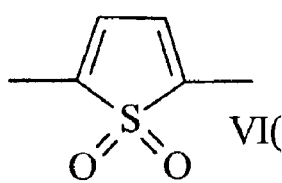
Figure 8:
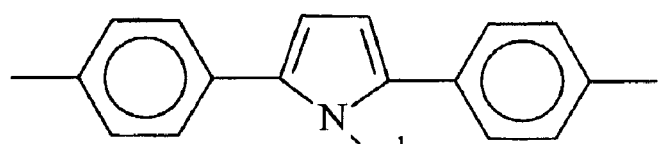

Formula VI:

Alternatively, the aromatic moiety can be a 5-membered-ring heteroaromatic group having the structure shown in FIG. 8, Formula VI. Preferred R groups are H, $C_1$–$C_5$ alkyl groups, and $C_6$–$C_{20}$ aryl groups, more preferably $C_6$–$C_{12}$ aryl groups. Examples of suitable E linking groups include pyrrolediyl(—$C_4H_3N$—) and thiophenediyl(—$C_4H_3S$—).

Examples of suitable aromatic moieties with Formula VI are shown in FIG. 8 as Formulae VI(a) through VI(h), where:
in Formula VI(a):
R is as described above for each of Formulae III, IV, V, VI, VII, VIII, IX, X through XIII; and
in Formula VI(h):
$R^9$ is a substituent on a heteroatom which can be the same or different at each occurrence and is selected from alkyl, aryl, heteroalkyl and heteroaryl.

Figure 9:
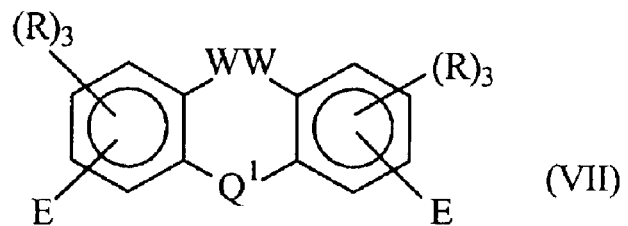
FIG. 9 shows Formula VII and Formulae VII(a) through VII(e) for an aromatic moiety useful in the process of the invention.
Figure 9:
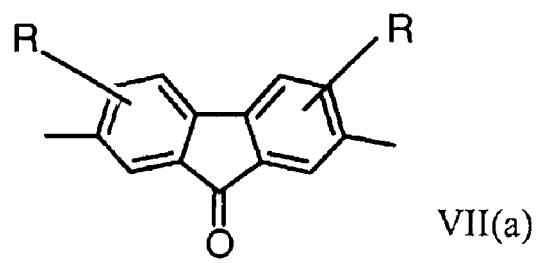
Figure 9:
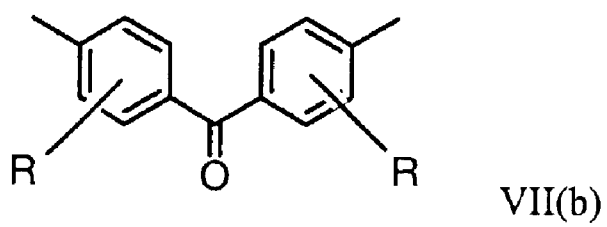
Figure 9:
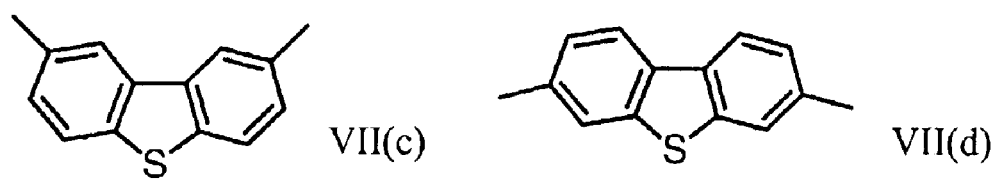
Figure 9:
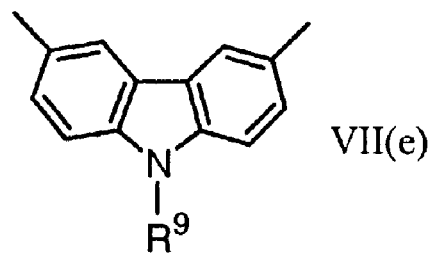

Formula VII:

Alternatively the aromatic moiety can have the structure shown in FIG. 9, Formula VII. The R groups are, preferably H, $C_1$–$C_{12}$ alkyl, $C_6$–$C_{10}$ aryl or alkyl-substituted aryl. Even more preferably, the R groups are H, $C_1$–$C_4$ alkyl or phenyl. Preferably the two W represent one single bond.

Examples of suitable second aromatic moieties of this type are those having the structure of Formulae VII(a) through Formula VII(e) where:
in Formulae VII(a), VII(b):
R is as described above for each of Formulae III, IV, V, VI, VII, VIII, IX, X through XIII; and
In Formula VII(e):
$R^9$ is a substituent on a heteroatom which can be the same or different at each occurrence and is selected from alkyl, aryl, heteroalkyl and heteroaryl.

Figure 10:
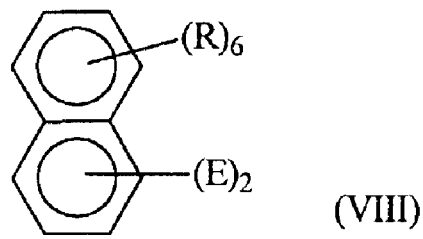
FIG. 10 shows Formulae VIII and Formulae VIII(a) through VIII(d) for an aromatic moiety useful in the process of the invention.
Figure 10:
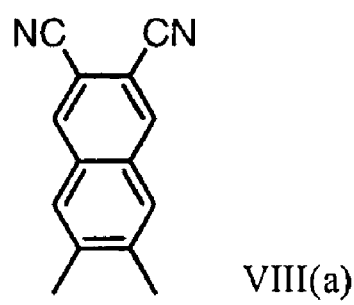
Figure 10:
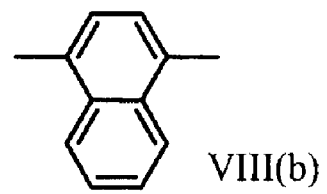
Figure 10:
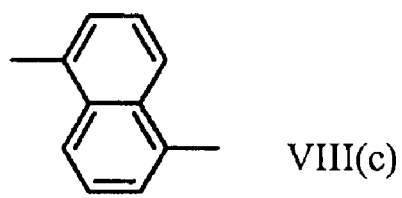
Figure 10:
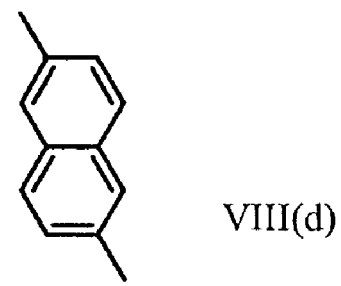
Figure 11:
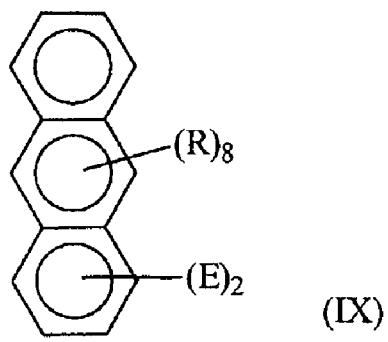
FIG. 11 shows Formulae IX and IX(a) for an aromatic moiety useful in the process of the invention.
Figure 11:
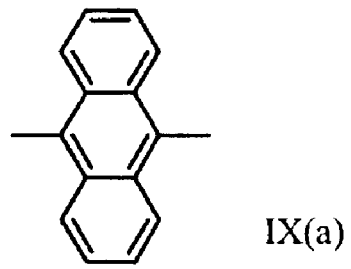
Figure 12:
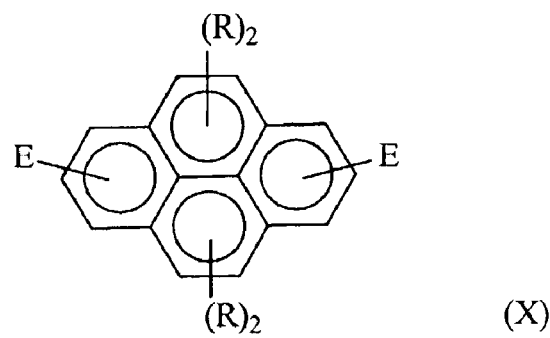
FIG. 12 shows Formulae X through XIII for an aromatic moiety useful in the process of the invention.
Figure 12:
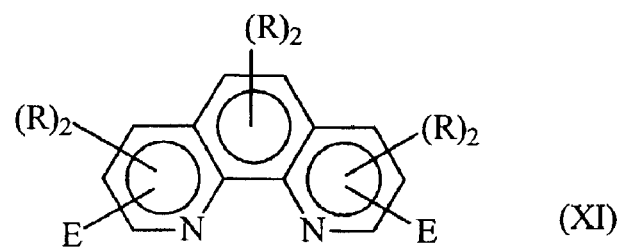
Figure 12:
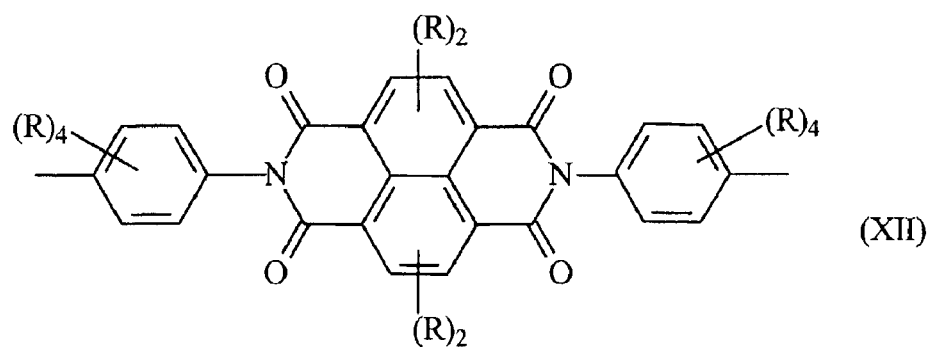
Figure 12:
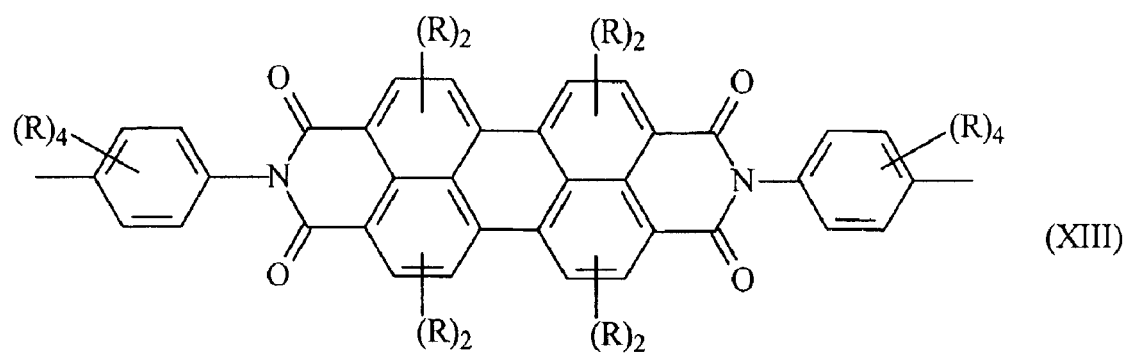

Formulae VIII through XIII:

Alternatively the aromatic moiety can be a divalent fused ring aromatic group having the structure shown in FIG. 10, Formula VIII, FIG. 11, Formula IX, and FIG. 12, Formulae X through XIII. The R groups are preferably H, $C_1$–$C_{20}$ alkyl or $C_6$–$C_{20}$ aryl.

In Formula VIII, the E's are preferably in the 1,4-, 1,5-, 1,8-, 2,3-, or 2,6-positions. Examples of suitable second aromatic moieties having Formula VIII are shown in FIG. 10, Formulae VIII(a) through VIII(d).

In Formula IX, the E's are preferably in the 1,4-, 1,5-, 1,8-, 2,6-, or 9,10-positions. An example of a suitable second aromatic moiety having Formula IX is shown in FIG. 11, Formula IX(a).

The polymers formed from the aromatic monomers discussed above can be homopolymers, alternating copolymers, or statistical copolymers. These different types of polymers can be exemplified as follows. A homopolymer can be formed by the reaction of the dibromo derivative of Formula IV(k) in FIG. 5 (in which the two single bonds are attached to bromines), with the diboronic acid derivative of Formula IV(k). A homopolymer can also be formed by the polymerization of the mono-bromo-mono-boronic acid derivative of Formula IV(k).

Alternatively, the dibromo derivative of Formula IV(k) can be reacted with the diboronic acid derivative of Formula IV(l) in FIG. 5, to form an alternating copolymer, in which an octafluoro-biphenyl monomeric unit alternates with a fluorophenyl monomeric unit.

Alternatively, the mono-bromo-mono-boronic acid derivative of Formula IV(k) can be reacted with the mono-bromo-mono-boronic acid derivative of Formula IV(l) to form a statistical copolymer with a statistical distribution of octafluoro-biphenyl and fluorophenyl monomeric units.

Alternatively, the dibromo derivative of Formula IV(k) and the dibromo derivative of Formula IV(l) can be reacted with the diboronic acid derivative of Formula IV(q), in FIG. 5. This will result in a copolymer in which a trifluoromethyl-phenyl monomeric unit alternates with a statistical distribution of octafluoro-biphenyl and fluorophenyl monomeric units.

In the polymers made from the monomers containing the above aromatic moieties, the R groups are essentially side chains off of the polymeric backbone. Thus, the final selection of the R groups should take into account the role these side chains may play in the properties of the final polymer. These properties include electronic properties, solubility properties, processibility properties, film-forming properties, to enhance or to reduce interchain interaction, to induce solubility in organic solvents, to induce compatibility in blends with host polymers, to induce high dielectric constant so as to solvate ions, to enhance ionic mobility, etc. In addition, where the R groups are substituted, steric effects of such substituents should be considered in substituent selection.

The polymers made according to the process of the invention, can be further substituted with perfluoroalkyl groups by treating the polymers with a material capable of introducing the perfluoroalkyl group into the aromatic ring (s) of the polymer. Suitable perfluoroalkylating materials include perfluoroalkyl halides, especially the iodides, and perfluoroalkyl sulfonyl chlorides in the presence of a ruthenium (II) catalyst.

B. The Catalyst

The catalyst in the process of the invention comprises a phosphine oxide transition metal complex dimer comprising two transition metal atoms bonded to at least one phosphine oxide ligand each, wherein each transition metal is bonded to said ligands via metal-phosphorus bonds, and wherein the two transition metal atoms are bridged via two halogen atoms. Preferably, the phosphine oxide transition metal complex dimer has Formula i or Formula ii shown in FIG. 1, wherein M is a transition metal selected from Periodic Groups 8 through 10; X is a halogen; $R^1$ and $R^2$ are the same or different at each occurrence and are independently selected from the group consisting of hydrocarbyl, substituted hydrocarbyl, heterocyclic, organometallic, Cl, Br, I, $SR^3$, $OR^4$, $PR^5R^6$, and $NR^7R^8$, where $R^3$, $R^4$, $R^5$, $R^6$, $R^7$, and $R^8$ are independently selected from the group consisting of hydrogen, hydrocarbyl, substituted hydrocarbyl, hydrocarbylamino, alkoxy, aryloxy, and heterocyclic, and optionally $R^1$ and $R^2$ can together form a ring.

M is preferably a Group 10 metal; most preferably Pd or Ni.

Examples of suitable $R^1$ and $R^2$ groups are methyl, ethyl, propyl, isopropyl, butyl, isobutyl, t-butyl, cyclopropyl, cyclobutyl, cyclopentyl, methylcyclopentyl, cyclohexyl, methylcyclohexyl, benzyl, phenyl, o-tolyl, m-tolyl, p-tolyl, xylyl, vinyl, allyl, butenyl, cyclohexenyl, cyclooctenyl, cyclooctadienyl, butynyl, methoxy, phenoxy, toluyl, chlorobenzyl, fluoroethyl, p-$CH_3$—S—$C_6H_5$, 2-methoxypropyl, $(CH_3)_3SiCH_2$, pyridyl, pyrimidinyl, pyrrolyl, pyrazolyl, pyrazinyl, pyridazinyl, oxazolyl, furanyl, quinolinyl, isoquinolinyl, thiazolyl, and thienyl, which can optionally be substituted with, e.g., halogen, lower alkyl, lower alkoxy, lower alkylthio, trifluoromethyl, lower acyloxy, aryl, heteroaryl, and hydroxy. $R^1$ and $R^2$ are preferably selected from $C_1$–$C_{20}$ hydrocarbyl and $C_4$–$C_{20}$ heterocyclic; most preferably $C_1$–$C_{12}$ hydrocarbyl.

The catalysts can generally be prepared by mixing the phosphine oxide ligands with simple metal salts in an appropriate solvent. The phosphine oxide ligands can be added separately or prepared in situ by combining chlorophosphine analogs, $R^1R^2P$—Cl, with water. Suitable metal salts include halides and acetates. Metal complexes with, for example, cyclooctadiene, can also be used. Catalysts having Formula i are formed when the molar ratio of phosphine oxide to metal is 2 to 1. Catalysts having Formula ii are formed when the molar ratio is 1 to 1.

The phosphine oxides can be prepared by any method. One method of forming phosphine oxides with diverse R groups, is via the use of polymer scaffolds as described in published International Patent Application WO 00/21663. This scheme comprises the steps of contacting (i) a phosphine selected from the group consisting of XP $R^1R^2$, XP(=O) $R^1R^2$, HP $R^1R^2$, and HP(=O) $R^1R^2$, wherein X, $R^1$ and $R^2$ are as defined above, with (ii) a solid support, resulting in at least one P in the phosphine attached indirectly or directly to the solid support via one or more covalent bonds, and (iii) replacing one or more of $R^1$ and $R^2$ with any other $R^1$ and $R^2$ defined above. With this reaction scheme, $R^1$ and $R^2$ can be symmetric, unsymmetric, or chiral.

The catalyst is present in an amount sufficient to allow the polymerization reaction to proceed. Generally, at least 0.1 mole percent, based on the total moles of monomers; preferably at least 0.3 mole percent.

C. Bases

Inorganic and organic bases may be used in the process of the invention. The term "organic base" includes sources of hydroxyl ions and Lewis bases which create a source of hydroxyl ions in combination with water. The function of the base is to convert the second reactive groups, Y, to the reactive species, —$B(OH)_3$. The most suitable base will depend on the nature of the monomers and solvent system.

Examples of inorganic bases useful in the process of the invention include alkali metal carbonates and bicarbonates. It can be convenient to add the base as a solid to the reaction mixture, in the presence of a trace amount of water. In practice, a few drops of water can be added to the reaction mixture with the base. Alternatively, the inorganic base can be added as a solution of an aqueous alkali metal carbonate or bicarbonate, such as 1–2M sodium or potassium carbonate. Examples of organic bases useful in the process of the invention include triethylamine and sodium t-butoxide. The amount of base present should be at least one mole per mole of second reactive group, i.e., boronic acid, boronic ester, or borane. Preferably, the base is employed in an amount in the range of 1 to 3 moles of base to each mole of second reactive group.

D. Solvent

The solvent serves as the vehicle or medium for the reaction. Solvents suitable for use in the process of the invention include those capable of dissolving the monomers to a solution concentration of at least 1 percent, more preferably at least 2 percent. In general, organic solvents are used. Preferably, the solvent is a $C_6$–$C_{20}$ aromatic group-containing compound, and more preferably is benzene, toluene, xylene, ethylbenzene, mesitylene, anisole, or a fluorinated analog thereof, with toluene being the most preferred. In a more preferred embodiment, the above aromatic solvent is mixed with a lesser amount of a second polar solvent which is capable of complexing metals. Examples of such polar solvents include tetrahydrofuran, dioxane, and dimethylformamide. In general, the second polar solvent is present in an amount of from about 10 to 40% by volume, based on the volume of the first aromatic solvent. Mixtures of more than one of each type of solvent can also be used.

Process

In the process of the invention, the order of addition of the components is not particularly critical. Most conveniently, the monomer mixture is first combined with the solvent, and the catalyst and base added to this combination.

The reaction is generally carried out at a temperature above 50° C., preferably at about 100° C. The total volume of solvent in the reaction should be such that efficient mixing can be maintained at reflux as the reaction mixture becomes increasingly viscous due to build-up of polymer molecular weight. This is generally in the range of 5–20 mL of solvent to every gram of polymer, preferably about 10 mL of toluene for every gram of polymer. The reaction time can be from a few hours to a few days. The polymer can be isolated from the reaction mixture using conventional techniques, such as evaporation or precipitation with a second solvent followed by filtration.

The process of the invention does not require an oxygen-free atmosphere, although one can be used. Thus the reaction can be carried out under reflux in an open system. This allows for more flexibility and lower coast than with previous processes which required an oxygen-free atmosphere.

Electronic Device

Figure 14:
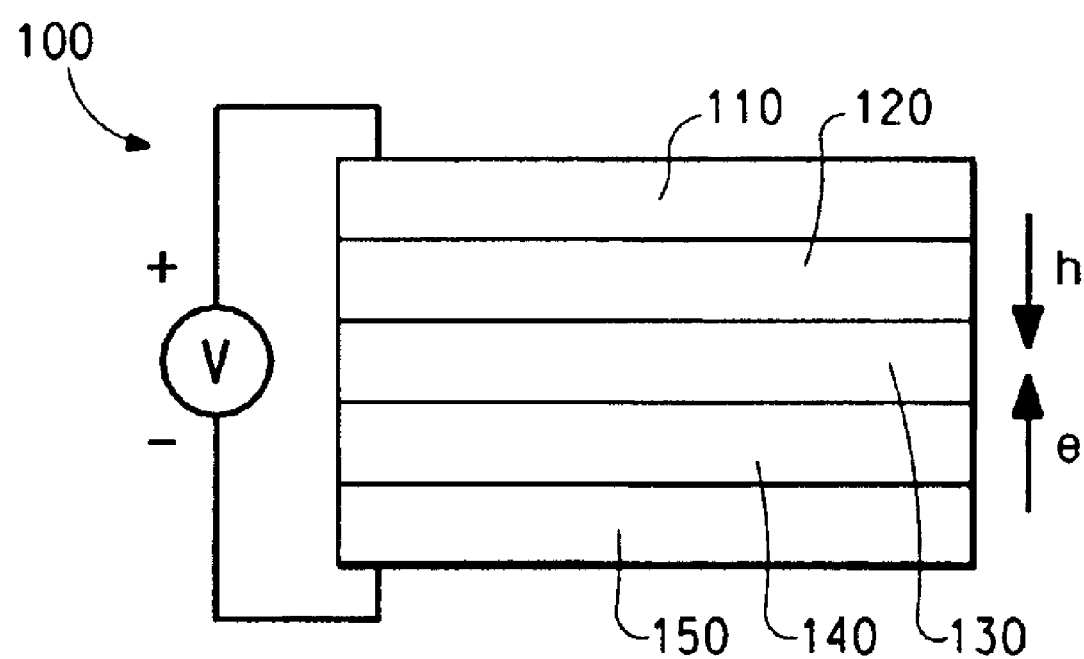
FIG. 14 is a schematic diagram of a light-emitting device (LED).

The present invention also relates to an electronic device comprising at least one photoactive layer positioned between two electrical contact layers, wherein at least one of the photoactive layers of the device includes the polymer made by the process of the invention. As shown in FIG. 14, a typical device 100 has an anode layer 110 and a cathode layer 150 and electroactive layers 120, 130 and optionally 140 between the anode 110 and cathode 150. Adjacent to the anode is a hole injection/transport layer 120. Adjacent to the cathode is an optional layer 140 comprising an electron transport material. Between the hole injection/transport layer 120 and the cathode (or optional electron transport layer) is the photoactive layer 130. The copolymers of the invention can be useful in the hole injection/transport layer 120 and/or in the photoactive layer 130 and/or the optional electron injection/transport layer 140.

The device generally also includes a support (not shown) which can be adjacent to the anode or the cathode. Most frequently, the support is adjacent the anode. The support can be flexible or rigid, organic or inorganic. Generally, glass or flexible organic films are used as a support. The anode 110 is an electrode that is particularly efficient for injecting or collecting positive charge carriers. The anode is preferably made of materials containing a metal, mixed metal, alloy, metal oxide or mixed-metal oxide. Suitable metals include the Group 11 metals, the metals in Groups 4, 5, and 6, and the Group 8–10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," Nature vol. 357, pp 477–479 (11 Jun. 1992).

The anode layer is 110 usually applied by a physical vapor deposition process or spin-cast process. The term "physical vapor deposition" refers to various deposition approaches carried out in vacuo. Thus, for example, physical vapor deposition includes all forms of sputtering, including ion beam sputtering, as well as all forms of vapor deposition such as e-beam evaporation and resistance evaporation. A specific form of physical vapor deposition which is useful is rf magnetron sputtering.

The copolymers of the invention may function as hole transport materials in layer 120. Other materials which may facilitate hole injection/transport include N,N'-diphenyl-N, N'-bis(3-methylphenyl)-[1,1'-biphenyl]-4,4'-diamine (TPD) and bis[4-(N,N-diethylamino)-2-methylphenyl](4-methylphenyl)methane (MPMP); and hole transport polymers such as polyvinylcarbazole (PVK); (phenylmethyl) polysilane, poly(3,4-ethylenedioxythiophene) (PEDOT); and polyaniline (PANI); electron and hole transporting materials such as 4,4'-N,N'-dicarbazole biphenyl (BCP); or light-emitting materials with good electron and hole transport properties, such as chelated oxinoid compounds, such as tris(8-hydroxyquinolato)aluminum ($Alq_3$).

The hole injection/transport layer 120 can be applied using any conventional means, including spin-coating, casting, and printing, such as gravure printing. The layer can also be applied by ink jet printing, thermal patterning, or physical vapor deposition.

In general, the anode 110 and the hole injection/transport layer 120 is patterned. It is understood that the pattern may vary as desired. The layers can be applied in a pattern by, for example, positioning a patterned mask or photoresist on the first flexible composite barrier structure prior to applying the first electrical contact layer material. Alternatively, the layers can be applied as an overall layer and subsequently patterned using, for example, a photoresist and wet chemical etching. The hole injection/transport layer can also be applied in a pattern by ink jet printing, lithography or thermal transfer patterning. Other processes for patterning that are well known in the art can also be used.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are describe in Markus, John, Electronics and Nucleonics Dictionary, 470 and 476 (McGraw-Hill, Inc. 1966).

Where the device 100 is a light-emitting device, the photoactive layer 130 will emit light when sufficient bias voltage is applied to the electrical contact layers. The copolymers of the invention may be used in the light-emitting active layer 130. Other known light-emitting materials include small molecule materials such as those described in, for example, Tang, U.S. Pat. No. 4,356,429, Van Slyke et al., U.S. Pat. No. 4,539,507, the relevant portions of which are incorporated herein by reference. Alternatively, such materials can be polymeric materials such as those described in Friend et al. (U.S. Pat. No. 5,247,190); Heeger et al. (U.S. Pat. No. 5,408,109); Nakano et al. (U.S. Pat. No. 5,317,169); the relevant portions of which are incorporated herein by reference. The light-emitting materials may be dispersed in a matrix of another material, with and without additives, but preferably form a layer alone. The active organic layer generally has a thickness in the range of 50–500 nm.

Where the electronic device 100 is a photodetector, the photoactive layer 130 responds to radiant energy and produces a signal either with or without a biased voltage. Materials that respond to radiant energy and is capable of generating a signal with a biased voltage (such as in the case of a photoconductive cells, photoresistors, photoswitches, phototransistors, phototubes) include, for example, many conjugated polymers and electroluminescent materials. Materials that respond to radiant energy and are capable of generating a signal without a biased voltage (such as in the case of a photoconductive cell or a photovoltaic cell) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, Journal of Electronic Materials, Vol. 23, pp 925–928 (1994); and MEH-PPV Composites with CN-PPV ("Efficient Photodiodes from Interpenetrating Polymer Networks", J. J. M. Halls et al. (Cambridge group) Nature Vol. 376, pp. 498–500, 1995).

The photoactive layer 130 containing the active organic material can be applied from solutions by any conventional means, including spin-coating, casting, and printing. The active organic materials can be applied directly by vapor deposition processes, depending upon the nature of the materials. It is also possible to apply an active polymer precursor and then convert to the polymer, typically by heating.

The cathode 150 is an electrode that is particularly efficient for injecting or collecting electrons or negative charge carriers. The cathode can be any metal or nonmetal having a lower work function than the first electrical contact layer (in this case, an anode). Materials for the second electrical contact layer can be selected from alkali metals of Group 1 (e.g., Li, Cs), the Group 2 (alkaline earth) metals, the Group 12 metals, the rare earths, the lanthanides, and the actinides. Materials such as aluminum, indium, calcium, barium, and magnesium, as well as combinations, can be used.

The cathode layer 150 is usually applied by a physical vapor deposition process. In general, the cathode layer will be patterned, as discussed above in reference to the anode layer 110 and conductive polymer layer 120. Similar processing techniques can be used to pattern the cathode layer.

Optional layer 140 can function both to facilitate electron transport, and also serve as a buffer layer or confinement layer to prevent quenching reactions at layer interfaces. Preferably, this layer promotes electron mobility and reduces quenching reactions. Examples of electron transport materials for optional layer 140 include metal chelated oxinoid compounds, such as tris(8-hydroxyquinolato) aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA); and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ).

It is known to have other layers in organic electronic devices. For example, there can be a layer (not shown) between the conductive polymer layer 120 and the active layer 130 to facilitate positive charge transport and/or band-gap matching of the layers, or to function as a protective layer. Similarly, there can be additional layers (not shown) between the active layer 130 and the cathode layer 150 to facilitate negative charge transport and/or band-gap matching between the layers, or to function as a protective layer. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers is preferably determined by balancing the goals of providing a device with high device efficiency.

The device 100 can be prepared by sequentially depositing the individual layers on a suitable substrate. Substrates such as glass and polymeric films can be used. In most cases the anode is applied to the substrate and the layers are built up from there. However, it is possible to first apply the cathode to a substrate and add the layers in the reverse order. In general, the different layers will have the following range of thicknesses: inorganic anode 110, 500–5000 Å, preferably 1000–2000 Å; conductive polymer layer 120, 50–2500 Å, preferably 200–2000 Å; light-emitting layer 130, 10–1000 Å, preferably 100–800 Å; optional electron transport layer 140, 50–1000 Å, preferably 200–800 Å; cathode 150, 200–10000 Å, preferably 300–5000 Å.

EXAMPLES

The following examples illustrate certain features and advantages of the present invention. They are intended to be illustrative of the invention, but not limiting. All percentages are by weight, unless otherwise indicated.

Example 1

This example illustrates the preparation of a catalyst having Formula i shown in FIG. 1, [bis-(di-t-butylphosphinous acid)]palladium chloride dimer $\{[(t-Bu)_2P(OH)]_2PdCl]\}_2$ Method A. In the dry box, a solution of 1.608 g (8.90 mmol) of $(t-Bu)_2P$—Cl in 50 mL of 1,4-dioxane and 160.0 mg (8.90 mmol) of $H_2O$ was stirred at room temperature for 10 min, and 1.0 g (4.45 mmol) of $Pd(OAc)_2$ was gradually added within 5 min. The resulting mixture was then removed from the dry box and refluxed for 5 h. The phosphorus-31 NMR spectrum of the reaction mixture at this point showed the $\delta$=125.5 (~5%), 123.5 (~45%), 123.3 (~45%) resonances, and no unchanged $(t-Bu)_2PCl$ and $(t-Bu)_2P(O)$H. After cooling to room temperature the mixture was concentrated by rotary evaporation to afford 1.85 g (89% yield) of [Bis-(di-t-butylphosphinous acid)]palladium (I) chloride dimer. $^1$H NMR (300 MHz, $CDCl_3$): $\delta$=1.37 (d, J=14.57 Hz) ppm. $^{13}$C NMR (76 MHz, $CDCl_3$): $\delta$=41.9 (t, J=14.41 Hz), 29.48 (s) ppm. $^{31}$P NMR (121 MHz, $CDCl_3$): $\delta$=124.0 ppm. $^1$H-coupled $^{31}$P NMR (121 MHz, $CDCl_3$): $\delta$ 124.9 (s) ppm. Anal. Calcd for $C_{32}H_{76}O_4P_4Pd_2$: C, 41.21; H, 8.21; P, 13.28; Cl, 7.60. Found: C, 41.21; H, 8.66; P, 13.28; Cl, 7.54. The crystallographic sample was obtained by slow recrystallization from a mixture of dichloromethane and hexane.

Method B. A 500 mL of round-bottomed flask equipped with magnetic stir bar was charged with 1.469 g (8.90 mm) of $(t-Bu)_2PH(O)$ which was generated from $(t-Bu)_2PCl$ and $H_2O$ in $CH_2Cl_2$, 1.0 g (4.45 mm) of $Pd(OAc)_2$ and 100 mL of 1,4-dioxane. The resulting mixture was then heated to a gentle reflux under open-to-air condition for 20 h. The phosphorus-31 NMR spectrum of the reaction mixture showed the $\delta$=125.5 (~5%) and 123.4 (~95%) resonance, and no unchanged $(t-Bu)_2PH(O)$. After cooling to room temperature the solution was concentrated by rotary evaporation, the residue was extracted with hexane (10×100 mL). The extracts were combined, dried under vacuum to afford 1.80 g (87% yield) of yellow solids. It was >95% pure by $^1$H and $^{31}$P NMR. $^{31}$P NMR (121 MHz, $CDCl_3$): $\delta$=124.0 ppm.

Method C. A 500 mL of round-bottomed flask equipped with magnetic stir bar was charged with 1.160 g (7.15 mmol) of $(t-Bu)_2PH(O)$, 0.621 g (3.50 mmol) of $PdCl_2$ and 100 mL of THF. The resulting mixture was then heated to a gentle reflux under open-to-air condition for 14 h. The phosphorus-31 NMR spectrum of the reaction mixture showed the $\delta$=123.5 (~5%), 122.7 (~95%) resonances, and no unchanged $(t-Bu)_2PH(O)$. After cooling to room temperature the solution was concentrated by rotary evaporation to afford 1.80 g (87% yield) of (di-t-butylphosphinous acid)palladium (I) chloride dimer.

Method D. In the dry box, a solution of 4.076 g (22.56 mmol) of $(t-Bu)_2P$—Cl in 135 mL of THF and 407 mg (22.61 mmol) of $H_2O$ was stirred at room temperature for 10 min, and 2.0 g (11.28 mmol) of $PdCl_2$ was gradually added within 5 min. The resulting mixture was then removed from the dry box and refluxed for 24 h. The phosphorus-31 NMR spectrum of the reaction mixture at this point showed the δ=123.5 (~5%), 122.7 (~80%) as major resonances. After cooling to room temperature the mixture was concentrated by rotary evaporation to afford 4.30 g (82% yield) of (di-t-butylphosphinous acid)palladium (I) chloride dimer.

The X-ray crystal analysis confirmed the dimer structure.

Example 2

This example illustrates the preparation of a catalyst having Formula ii shown in FIG. 1, (di-t-butylphosphinous acid)palladium dichloride dimer [(t-Bu)$_2$P(OH) PdCl$_2$]$_2$ Method A. A 500 mL of round-bottomed flask equipped with magnetic stir bar was charged with 1.160 g (7.15 mm) of (t-Bu)$_2$PH(O), 1.242 g (7.00 mm) of PdCl$_2$ and 100 mL of THF. The resulting mixture was then heated to a gentle reflux under open-to-air condition for 20 h. The phosphorus-31 NMR spectrum of the reaction mixture showed the δ 146.96 (singlet, ca. 95%) and 123.0 (singlet, ca. 5%) resonances, and no unchanged (t-Bu)$_2$PH(O). After cooling to room temperature, the solution was filtered and concentrated by rotary evaporation to afford 2.0 g of dichloro(di-t-butylphosphinous acid)palladium (II) dimer. $^1$H NMR (500 MHz, CDCl$_3$): δ 5.23 (m, 1H), 1.43 (d, J=16.3 Hz, 18H) ppm. $^{13}$C NMR (125 MHz, CDCl$_3$): δ 42.2 (d, J$_{P-C}$=25.4 Hz), 28.0 ppm. $^{31}$P NMR (CDCl$_3$, 202 MHz): δ 145.0 ppm. Anal. Calcd for C$_{16}$H$_{38}$P$_2$O$_2$C$_{14}$Pd$_2$: C, 28.3; H, 5.64. Found: C, 27.86; H, 5.47. The crystallographic sample was obtained by slow recrystallization from a mixture of dichloromethane and hexane. The analysis indicated the dimer structure.

Method B. A solution of 2.0 g (7.00 mmol) of Pd(COD)Cl$_2$ and 1.16 g (7.03 mmol) of (t-Bu)$_2$PH(O) in 100 mL of 1,4-dioxane was boiled under reflux for 17 h. Examination of the reaction mixture by $^1$H-coupled $^{31}$P NMR at this point revealed only a singlet at δ147.6 ppm. Solvent was removed from filtrate in vacuo and the residue was dissolved in CH$_2$Cl$_2$. Evaporation of the filtrate in vacuum followed by crystallization from a mixture of CH$_2$Cl$_2$/hexane (95:5 volume ratio) gave 2.0 g (84% yield) of dark brown [(t-Bu)$_2$P—(OH)PdCl$_2$]$_2$. $^1$H NMR (500 MHz, CDCl$_3$): δ=5.23 (m, 1H), 1.43 (d, J=16.3 Hz, 18H) ppm. $^{13}$C NMR (125 MHz, CDCl$_3$): δ=42.2 (d, J$_{P-C}$=25.4 Hz), 28.0 ppm. $^{31}$P NMR (CDCl$_3$, 202 MHz): δ=145.0 ppm.

Method C. In the dry box, a solution of 1.019 g (5.64 mmol) of (t-Bu)$_2$P—Cl in 100 mL of THF and 102 mg (5.64 mmol) of H$_2$O was stirred at room temperature for 10 min, and 1.0 g (5.64 mmol) of PdCl$_2$ was gradually added within 5 min. The resulting mixture was then removed from the dry box and refluxed for 6 h. The phosphorus-31 NMR spectrum of the reaction mixture at this point showed the δ=146.6 (singlet, ca. 70%) and 122.7 (singlet, ca. 30%) resonances. After the resulting mixture was refluxed for another 18 h, the crude product was shown by its phosphorus-31 NMR spectrum to be a mixture of the title complex 2 and di-t-butylphosphinechloride palladium chloride dimer with a phosphorus-31 NMR spectrum of δ=164.7 (singlet) as major components in approximately equal amounts.

Example 3

This example illustrates the preparation of a polyfluorene copolymer, which is an alternating copolymer, using the process of the invention.

Toluene (10 ml) and DMF (2 ml) were added to a 50 ml Schlenck tube equipped with a stirring bar and containing 2,7-diiodo-9,9-bis(2-ethylhexyl)fluorene (1.07 g, 1.66 mmol) and 1,4-benzenediboronicacid bis(neopentyl glycol) cyclic ester (0.50 g, 1.66 mmol). Then the catalyst from Example 1 (15 mg, 0.0166 mmol) and potassium carbonate (2.00 g, 14.47 mmol) were added. The solution was heated in an oil bath at 100° C. for 48 h with vigorous stirring. The mixture was cooled to room temperature, and then precipitated into a solution of methanol (100 ml), acetone (100 ml) and concentrated hydrochloric acid (5 ml). After stirring for 2 h, the mixture was filtered. The solid residue was then dissolved in chloroform, and again precipitated into a solution of methanol (100 ml), acetone (100 ml) and concentrated hydrochloric acid (5 ml). After stirring for 1 h, the mixture was filtered. Finally the residue was successively washed in methanol, water and methanol and dried in vacuo. The polymer was analyzed by nmr. The number average molecular weight was determined by gel permeation chromatography to be 7400.

What is claimed is:

1. A process for making aromatic polymers, the process comprising the step of providing a reaction mixture comprising:

(a) a monomer mixture selected from:
(i) a first monomer mixture comprising a plurality of at least one first aromatic monomer and a plurality of at least one second aromatic monomer, wherein the first aromatic monomer has at least two first reactive groups and has a Formula (I) below:

X—Ar$^1$—X        (I)

wherein:
X is the first reactive group selected from bromo, iodo, chloro, p-toluenesulfonate, methylsulfonate, and trifluoromethylsulfonate, and
Ar$^1$ is an aromatic moiety;
and wherein the second aromatic monomer has at least two second reactive groups and has a Formula (II) below:

Y—Ar$^2$—Y        (II)

wherein:
Y is the second reactive group selected from a boronic acid, a boronic ester and a borane, and
Ar$^2$ is an aromatic moiety that is same or different from Ar$^1$ in Formula (I); and
(ii) a second monomer mixture comprising a plurality of at least one third aromatic monomer and at least one fourth aromatic monomer, wherein the at least one third aromatic monomer has at least one first reactive group and at least one second reactive group and having Formula (III) below:

X—Ar$^3$—Y        (III)

wherein:
X and Y are as defined in Formula (I) and (II) respectively, and
Ar$^3$ is an aromatic moiety that is the same or different from Ar$^1$ in Formula (I) and Ar$^2$ in Formula (II);
and wherein the at least one fourth aromatic monomer has at least one first reactive group and at least one second reactive group and having Formula (IV) below:

X—Ar$^4$—Y        (IV)

wherein:
X and Y are as defined in Formula (I) and (II) respectively, and
Ar$^4$ is an aromatic moiety that is the same or different from Ar$^1$ in Formula (I); Ar$^2$ in Formula (II) and Ar$^3$ in Formula (III);

(b) a catalytic amount of a catalyst comprising a phosphine oxide transition metal complex dimer comprising two transition metal atoms bonded to at least one phosphine oxide ligand each, wherein each transition metal is bonded to said ligands via metal-phosphorus bonds, and wherein the two transition metal atoms are bridged via two halogen atoms, (c) a base, and (d) an organic solvent, and wherein the mixture is provided without the use of an oxygen-free environment.

2. The process of claim 1, wherein the base is an inorganic material.

3. The process of claim 1, wherein the base is an organic material.

4. The process of claim 1, wherein the mixture is a single phase system.

5. The process of claim 1, wherein the mixture is a multi-phase system.

* * * * *